(12) United States Patent
Dupuis et al.

(10) Patent No.: US 8,169,108 B2
(45) Date of Patent: May 1, 2012

(54) CAPACITIVE ISOLATOR

(75) Inventors: Timothy Dupuis, Austin, TX (US); Axel Thomsen, Austin, TX (US); Zhiwei Dong, Austin, TX (US); Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1013 days.

(21) Appl. No.: 12/060,049

(22) Filed: Mar. 31, 2008

(65) Prior Publication Data

US 2009/0017773 A1 Jan. 15, 2009

Related U.S. Application Data

(63) Continuation-in-part of application No. 11/772,178, filed on Jun. 30, 2007, now Pat. No. 8,049,573, which is a continuation-in-part of application No. 11/089,348, filed on Mar. 24, 2005, now Pat. No. 7,302,247, which is a continuation-in-part of application No. 10/860,399, filed on Jun. 3, 2004, now Pat. No. 7,421,028, and a continuation-in-part of application No. 10/860,519, filed on Jun. 3, 2004, now Pat. No. 7,447,492, and a continuation-in-part of application No. 11/020,977, filed on Dec. 22, 2004, now Pat. No. 7,376,212, and a continuation-in-part of application No. 11/064,413, filed on Feb. 23, 2005, now Pat. No. 7,460,604.

(51) Int. Cl.
*H04B 1/18* (2006.01)

(52) U.S. Cl. ........................................... 307/109

(58) Field of Classification Search ............... 307/109
See application file for complete search history.

(56) References Cited

U.S. PATENT DOCUMENTS 3,058,078 A 10/1962 Hoh
3,537,022 A 10/1970 Regan
(Continued)

FOREIGN PATENT DOCUMENTS

DE 10100282 A1 7/2002
(Continued)

OTHER PUBLICATIONS

"Publications—Geoff Walker", http://www.itee.uq.edu.au/~walkerg/publications/pubs_grw_links.html, May 2007.
(Continued)

*Primary Examiner* — Fritz M Fleming
(74) *Attorney, Agent, or Firm* — Trop, Pruner & Hu, P.C.

(57) ABSTRACT

An integrated circuit provides high voltage isolation capabilities. The circuit includes a first area containing a first group of functional circuitry located in a substrate of the integrated circuit. This circuit also includes a second area containing a second group of functional circuitry also contained within the substrate of the integrated circuit. Capacitive isolation circuitry located in the conductive layers in the integrated circuit provide a high voltage isolation link between the first group of functional circuitry and the second group of functional circuitry. The capacitive isolation circuitry distributes a first portion of the high voltage isolation signal across the first group of capacitors in the capacitive isolation circuitry and distributes a second portion of the high voltage isolation circuitry across the second group of capacitors in the capacitive isolation circuitry.

12 Claims, 12 Drawing Sheets

U.S. PATENT DOCUMENTS

| | | |
|---|---|---|
| 3,713,148 A | 1/1973 | Cardullo et al. |
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Humhyr |
| 4,227,045 A | 10/1980 | Chelcun et al. |
| 4,302,807 A | 11/1981 | Mentler |
| 4,425,647 A | 1/1984 | Collins et al. |
| 4,459,591 A | 7/1984 | Haubner et al. |
| 4,523,128 A | 6/1985 | Stamm et al. |
| 4,536,715 A | 8/1985 | Basarath et al. |
| 4,538,136 A | 8/1985 | Drabing |
| 4,547,961 A | 10/1985 | Bokil et al. |
| 4,650,981 A | 3/1987 | Foletta |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A * | 10/1988 | Meinel .......................... 361/765 |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto et al. |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglas |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham |
| 5,831,426 A | 11/1998 | Black, Jr. et al. |
| 5,831,525 A | 11/1998 | Harvey |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A | 9/1999 | Haigh |
| 5,969,590 A | 10/1999 | Gutierrez |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,082,744 A | 7/2000 | Allinger et al. |
| 6,087,882 A | 7/2000 | Chen et al. |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,452,519 B1 | 9/2002 | Swanson |
| 6,525,566 B2 | 2/2003 | Haigh et al. |
| 6,538,138 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,012,388 B2 | 3/2006 | Lin et al. |
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey |
| 7,057,491 B2 | 6/2006 | Dempsey |
| 7,075,329 B2 | 7/2006 | Chen et al. |
| 7,102,388 B2 | 9/2006 | Murabayashi et al. |
| 7,315,592 B2 | 1/2008 | Tsatsanis et al. |

FOREIGN PATENT DOCUMENTS

| | | |
|---|---|---|
| FR | 267970 A1 | 1/1993 |
| GB | 2173956 A1 | 10/1986 |
| JP | 57-132460 A1 | 8/1982 |
| JP | 7-44515 | 10/1991 |

| | | |
|---|---|---|
| JP | 2000-174666 | 6/2000 |
| WO | WO99/21332 A1 | 4/1999 |
| WO | 03/050376 | 6/2003 |

OTHER PUBLICATIONS

A Tale of Two Modems, Sensors Magazine, Apr. 2002, pp. 30-32.
Akiyama, Noboru, A High-Voltage Monolithic Isolator for a Communication Network Interface, IEEE Transactions on Electron Devices, May 2002, pp. 895-901, vol. 49, No. 5.
Analog Devices—ADuM130x/ADuM140x; Coupler Technology Removes the Limitations of Optocoupler Solutions, pp. 2-15, May 2003.
Baker, Bonnie C., The Basics of Isolation Circuits, Sensors and Systems, May 1996, pp. 46-47.
Bindra, Ashok, MEMS-Based Magnetic Coils Exceed the Limitations of Optical Couplers, Electronic Design, Jul. 24, 2000, p. 43.
Bourgeois, J.M., "PCB-based Transformer for Power MOSFET Drive," 0-7803-1456-5-94 at pp. 283-244, IEEE, 1994.
Choina, Simon, Planar Transformers Make Maximum Use of Precious Board Space, Electronic Design, Mar. 9, 1999, pp. 97 & 99.
Clark, Ron, RS-232C/422/485 Line Isolation Solves More Than Fault Problems, EDN, Sep. 28, 1995, pp. 103-115.
EDN'S 100 Top Products 1994, EDN, Dec. 8, 1994, pp. 58.
Green, M.W. Miniature Multilayer Spiral Inductors for GsAs MMICs, 1989 IEEE GaAs Symposium, 1989, pp. 303-306.
Hoskins, Kevin, Isolated ADC Reduces Power Consumption, EDN, Mar. 30, 1995, pp. 73-74.
Ichio Aoki et al.; Fully Integrated CMOS Power Amplifier Design Using the Distributed Active-Transformer Architecture; IEEE Journal of Solid State Circuits, vol. 37, No. 3, Mar. 2002; pp. 371-383.
IEEE Standard for a High Performance Serial Bus, IEEE Std. 1395-1995, Dec. 1995, pp. 1-392, NY.
Impedance Matching Transformers, Transformer Applications, pp. 72-85, 2001.
Kester, W., Origins of Real-World Signals and Their Units Measurement, ch. 1, pp. 1.1-1.11, 2003.
Kilger, R. et al., "Micromachined magnetics: a new step in the evolution of isolation technology," Electronic Engineering, Jun. 2000 at pp. 27-32.
Klein William, Applications of Signal Isolation, Sensors Magazine, Apr. 2000, pp. 70-74.
Knoedl, G., A Monolithic Signal Isolator, IEEE, 1989, pp. 165-170.
Kojima, Yasuyuki, 2.3 kVac 100 MHz Multi-Channel Monolithic Isolator IC, 2000 Proceedings Annual IEEE International ASIC Conference, 2000, pp. 309-312.
Kojima, Yasuyuki, A Novel Monolithic Isolator for a Communications Network Interface IC, 1998 Proceedings Annual IEEE International ASIC Conference, 1998, pp. 255-258.
Kuhn, William, An RF-Based IEEE 1394 Ground Isolator Designed in a Silicon-on-Insulator Process, 44th IEEE 2001 Midwest Symposium on Circuits and Systems, Aug. 2001, pp. 764-767.
Lam, Sam, High-Isolation Bonding Pad Design for Silicon RFIC up to 20 GHz, IEEE Electron Device Letters, Sep. 2003, vol. 24, No. 5, pp. 601-603.
Long, John R., A 1.9 GHz Low-Voltage Silicon Bipolar Receiver Front-End for Wireless Personal Communications Systems, IEEE Journal of Solid-State Circuits, Dec. 1995, vol. 30, No. 12, pp. 1438-1448.
Long, John R., Monolithic Transformers for Silicon RF IC Design, IEEE Journal of Solid-State Circuits, September 2000, vol. 35, No. 9, pp. 1368-1382.
Mammano, Bob, Isolated Power Conversion: making the case for secondary-side control, EDN, Jun. 7, 2001, pp. 123-127.
Martel, Jesus, Analysis of a Microstrip Crossover Embedded in a Multilayered Anisotropic and Lossy Media, IEEE Transactions on Microwave Theory and Techniques, March 1994, pp. 424-432, vol. 32, No. 3.
Munzer, M., Coreless transformer a new technology for half bridge driver IC's, pp. 1-4, 2000.
Pickering, Paul, A System Designer's Guide to Isolation Devices, Sensors, Jan. 1999, pp. 14-26.
Ronkainen, H., IC compatible planar inductors on silicon, IEE Proc.-Circuits Devices Syst., Feb. 1997, vol. 144, No. 1, pp. 29-35.
Schweber, Bill, MEMS-Based Digital Isolator Answers Need for Extreme I/O Speed, EDN, Jul. 20, 2000, p. 24.
Schweher, Bill, DAAs go for the Silicon, EDN, Feb. 17, 2000, pp. 119-130.
Simburger, Werner, A Monolithic Transformer Coupled 5-W Silicon Power Amplifier with 59% PAE at .9Ghz, IEEE Journal of Solid-State Circuits, Dec. 1999, vol. 34, No. 12, pp. 1881-1892.
Sorenson, Jeff, Direct-Access Arrangements Are Crucial to Successful Embedded-Modem Designs, Electronic Design, Aug. 20, 2001, pp. 66-78.
Stapleton, Helen, Isolation Techniques for High-resolution Data-acquisition Systems, EDN, Feb. 1, 2000, pp. 113-118.
Tang, S.C., A Low-Profile Wide-Band Three-Port Isolation Amplifier with Coreless Printed-Circuit-Board (PCB) Transformers, IEEE Transactions on Industrial Electronics, Dec. 2001, vol. 48, No. 6, pp. 1180-1187.
Walker, Geoff, An Isolated MOSFET Gate Driver, pp. 1-6, 1996.
Walker, Geoffry, Modulation and Control of Multilevel Converters, Thesis submitted for Doctor of Philosophy (The University of Queensland), Nov. 16, 1999, pp. 1-202.
Ward Titus, John Kenney, "10 GHz VCO for 0.13um CMOS Sonet CDR," Analog Devices, pp. 1-4, Jun. 2006.
Wolfs, P.J., An Improved Transformer Coupled MOSFET/IGBT Driver, Journal of Electrical and Electronic Engineering, Australia—IE Aust. & IREE Aust., Sep. 1991, vol. 11, No. 03, pp. 197-200.
Young, Ron, Feedback Isolation Augments Power-Supply Safety and Performance, EDN, Jun. 19, 1997, pp. 141-146.
Zhou, Jian-Jun and Allstot, David, A Fully Integrated CMOS 900MHz LNA Utilitzing Monolithic Transformers, ISSCC Digest of Technical Papers, pp. 132-133, 1998.
Zhou, Jianjun, Monolithic Transformers and Their Application in a Differential CMOS RF Low-Noise Amplifier, IEEE Journal of Solid-State Circuits, Dec. 1998, pp. 2020-2027.

* cited by examiner

US 8,169,108 B2

CAPACITIVE ISOLATOR

CROSS-REFERENCE TO RELATED APPLICATIONS

The present invention is a Continuation-in-Part of U.S. patent application Ser. No. 11/772,178, filed Jun. 30, 2007, entitled "BIDIRECTIONAL MULTIPLEXED RF ISOLATOR," which is a continuation-in-part of pending U.S. application Ser. No. 11/089,348 filed on Mar. 24, 2005 entitled SPREAD SPECTRUM ISOLATOR which is a continuation-in-part of Ser. No. 10/860,399 filed on Jun. 3, 2004 entitled TRANSFORMER ISOLATOR FOR DIGITAL POWER SUPPLY, co-pending U.S. application Ser. No. 10/860,519 filed on Jun. 3, 2004 entitled ON-CHIP TRANSFORMER ISOLATOR, and co-pending U.S. application Ser. No. 11/020,977 filed on Dec. 22, 2004 entitled RF ISOLATOR WITH DIFFERENTIAL INPUT/OUTPUT and co-pending U.S. patent application Ser. No. 11/064,413 filed on Feb. 23, 2005 entitled RF ISOLATOR FOR ISOLATING VOLTAGE SENSING AND GATE DRIVERS.

TECHNICAL FIELD OF THE INVENTION

The present invention relates to digital isolators, and more particularly, to digital isolators providing isolation for voltage sensing and gate drivers.

BACKGROUND OF THE INVENTION

Within power conversion products, there is a need for high speed digital links that provide high isolation at a low cost. Typical digital links within power conversion products require a speed of 50-100 megabits per second. Isolation between the input and output of power conversion products is required in the range of 2,500-5,000 V. Existing solutions for providing a high speed digital isolation link have focused on the use of magnetic pulse couplers, magnetic resistive couplers, capacitive couplers and optical couplers.

Referring now to FIG. 1, there is illustrated the general block diagram of a system using a magnetic pulse coupler to isolate a digital link 102 between a driver 104 and a detector 106. The driver 104 resides upon one side of the digital link 102 and transmits information over the digital link 102 to the detector 106 residing on the other side of the digital link. Resting between the driver 104 and detector 106 is a pulse transformer 108. The pulse transformer 108 provides an electromagnetically coupled transformer between the driver 104 and detector 106. The pulse transformer 108 generates a pulse output in response to a provided input from the driver as illustrated in FIG. 2. The input from the driver 104 consists of the two pulses 202 and 204. Each pulse 202, 204 consists of a rising edge 206 and a falling edge 208. In response to a rising edge 206, the output of the pulse transformer 108 generates a positive pulse 210. The falling edge 208 of a pulse generates a negative pulse 212. The pulse transformer circuit illustrated with respect to FIGS. 1 and 2 suffers from a number of deficiencies. These include start-up where the detector 106 will not know at what point the input from the driver has begun, whether high or low until a first edge is detected. Additionally, should any error occur in the pulse output of the pulse transformer 108, the detector 106 would have a difficult time determining when to return to a proper state since there may be a long period of time between pulses.

Referring now to FIG. 3, there is illustrated an alternative prior art solution making use of a magneto resistive coupler. The magneto resistive coupler 302 consists of a resistor 304 and associated transformer 306. The resistor 304 has a resistance value that changes responsive to the magnetic flux about the resistor. The transformer detector 306 utilizes a wheatstone bridge to detect the magnetic flux of the resistor and determined transmitted data.

Another method of isolation between a driver 404 and a detector 406 is illustrated in FIG. 4. The driver 404 and the detector 406 are isolated on opposite sides of a digital link 402 by a capacitor 408. The capacitor 408 capacitively couples the driver 404 and detector 406 together to achieve a level of isolation. A problem with the use of capacitive coupling to isolate digital links is that capacitive coupling provides no common mode rejection.

An additional problem with some isolator designs involves the reception of RF interference from nearby transmitting GSM, DCS and CDMA cellular telephones. The problem is caused by the application printed circuit board acting as a dipole antennae at GHz frequencies. This results in large common mode signals being seen at the isolator at RF frequencies. Some manner for minimizing these large common mode signals at GHz frequencies would be highly desirable.

Thus, an improved method for providing isolation over high speed digital links within power supply components would be greatly desirable.

SUMMARY OF THE INVENTION

The present invention, as disclosed and described herein, in one aspect thereof, comprises an integrated circuit having voltage isolation capabilities. A first area of the integrated circuit contains a first group of functional circuitry located within a substrate of the integrated circuit. A second area of the integrated circuit contains a second group of functional circuitry, also located within the substrate of the integrated circuit. Capacitive isolation circuitry is located within conductive layers of the integrated circuit and provides a high voltage isolation link between the first group of functional circuitry and the second group of functional circuitry. The capacitive isolation circuitry distributes a first portion of the high voltage isolation signal across a first group of capacitors in the capacitive isolation circuitry and distributes a second portion of the high voltage isolation signal across the second group of capacitors in the capacitive isolation circuitry.

BRIEF DESCRIPTION OF THE DRAWINGS

For a more complete understanding of the present invention and the advantages thereof, reference is now made to the following description taken in conjunction with the accompanying Drawings in which:

FIG. 12c is a block diagram of the logic circuit of FIG. 17a;

DETAILED DESCRIPTION OF THE INVENTION

Figure 1:
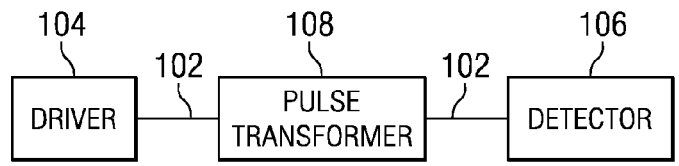
FIG. 1 illustrates a block diagram of a prior art magnetic pulse coupler isolator.
Figure 2:
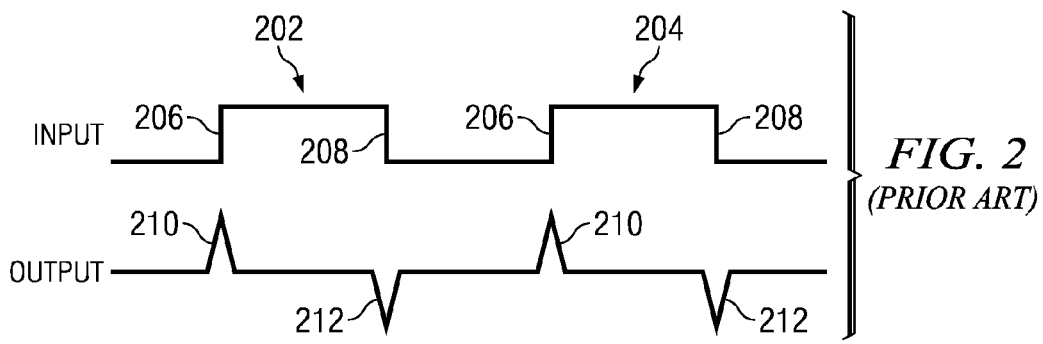
FIG. 2 illustrates the input and output signals of the prior art magnetic pulse transformer of FIG. 1.
Figure 3:
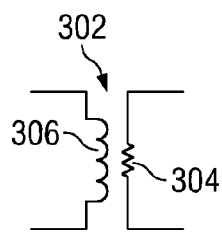
FIG. 3 illustrates a prior art magneto resistive coupler.
Figure 4:
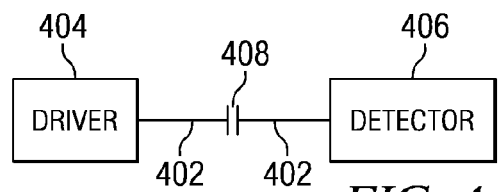
FIG. 4 illustrates a prior art capacitive coupler.
Figure 5:
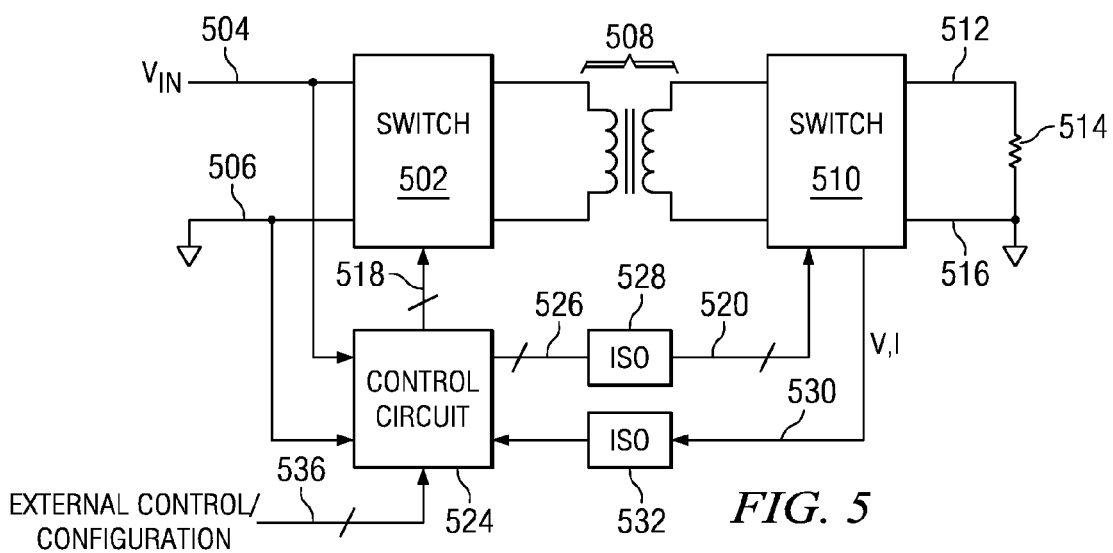
FIG. 5 illustrates a switched power supply including isolation circuitry.

Referring now to the drawings, and more particularly to FIG. 5, there is illustrated a block diagram of a DC-DC switching power supply utilizing a capacitive isolation link. Switching power supplies utilize a plurality of switches which are turned on and off to switch an input DC voltage across an inductor to a load, the output voltage at a different DC voltage level. By switching the current inductively coupled through the inductor to the load in a particular manner, a DC output voltage at a different voltage level than the input DC voltage can be provided to the load. The controlled switching is typically facilitated with some type of control circuit. This control circuit can be an analog control circuit formed from a plurality of analog discrete devices, or it can be a digital circuit. In digital control circuits, digital signal processors (DSPs) and microcontroller units (MCU) have been utilized. The DSPs control the duty cycle and relative timing of the switches such that the edges of each control pulse to the various transistor switches controlling power delivery to the load is varied. In order to perform this operation in the digital domain, the DSP must perform a large number of calculations, which requires a fairly significant amount of code to be generated to support a specific power supply topology, operating frequency, component characteristics and performance requirements. For example, inductor size decreases with increasing PWM frequency, dead times increase with increasing transistor turn-off times, and so on. Although DSPs can handle the regulation tasks, they are fairly complex and expensive and code changes in power supply applications are difficult.

Referring further to FIG. 5, the power supply includes a primary switch group 502 that is operable to receive an input voltage on a node 504, this being a DC voltage, and ground on a node 506. The primary switch group 502 is coupled through a transformer 508 to a secondary switch group 510. The secondary switch group 510 is operable to drive an input voltage node 512 that is connected to one terminal of a load 514, the secondary switch group 510 also having a ground connection on a node 516, the load 514 disposed between the node 512 and the node 516. The two switch groups 502 and 510 are operable to operate in conjunction with various pulse inputs on a control bus 518 associated with the primary switch group 502 and with various pulse inputs on a control bus 526 associated with the secondary switch group 510.

A digital control circuit 524 is provided for controlling the operation of the primary switch group 502 and the secondary switch group 510. The voltages on nodes 504 and 506 are provided as inputs to the digital control circuit 524 for sensing the voltage and current on the primary side, the digital control circuit 524 generating the information on the bus 518 for control of the primary switch group 502. The control circuit 524 must be isolated from the secondary group switch 510, since there can be a significant DC voltage difference therebetween. This is facilitated by driving the bus 526 through a capacitive isolation circuit 528, such as the capacitive isolation circuit which will be discussed herein below, to drive the bus 520. Similarly, the control circuit 524 is operable to sense the voltage and current levels on the output node 512 through sense lines 530 which are also connected through a capacitive isolation circuit 532 to the digital control circuit 524. The digital control circuit 524 is also interfaced to a bus 536 to receive external control/configuration information. This can be facilitated with a serial databus such as an SMB serial databus.

Figure 6:
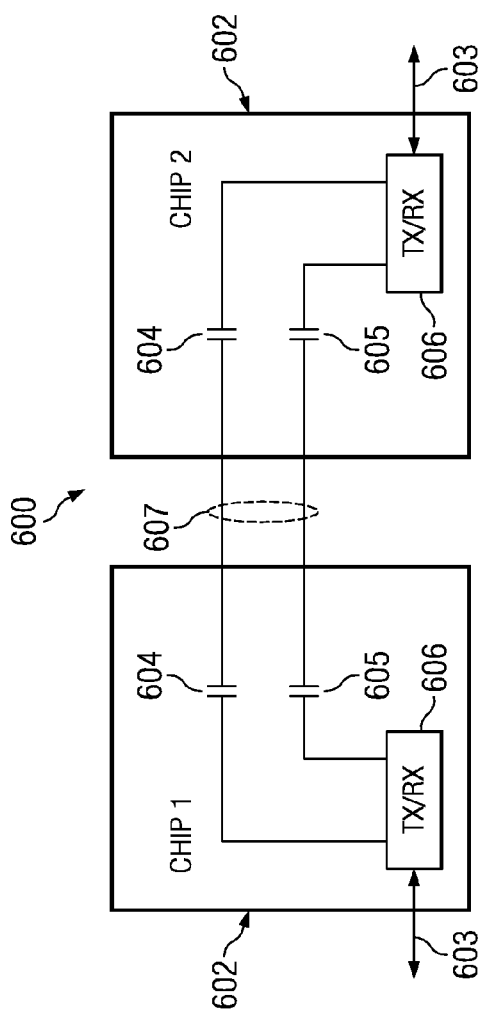
FIG. 6 illustrates a capacitive isolation link of the present disclosure.

Referring now to FIG. 6, there is illustrated the capacitive isolation link of the present disclosure. The capacitive isolation link 600 of the present disclosure is implemented by integrating a portion of the link in two chips or dies between which a high rate data link with voltage isolation is required. Each chip 602 includes a pair of capacitors 604 and 605 and transmit and receive circuitry 606 for providing the capacitive isolation link 600 between the chips. The capacitors may comprise vertical, horizontal or finger capacitors. Alternatively, the chip 602 could include only transmit circuitry or receive circuitry with the partnered chip, including a corresponding receiver or transmitter. RF signals are generated within the transmit/receive circuitry 606 on one side of the capacitive isolation link, and the RF signals are transmitted between the chips 602 utilizing the connection through capacitors 604 and 605 in each chip and the capacitive coupling therebetween.

Once the RF signals are received at the receiving side, the transmit and receive circuitry 606 detects the data contained within the transmission from the first chip and utilizes the data as appropriate. While the description with respect to FIG. 6 only illustrates the capacitors 604 and 605 and transmit and receive circuitry 606 within each chip 602, additional circuitry will be implemented on the chips 602 for performing processing functions associated with the data transmitted over the capacitive isolation link 600. The data transmitted over the capacitive isolation link 600 may be transmitted using either frequency modulation techniques or amplitude modulation techniques. In the preferred embodiment of the disclosure, discussed with respect to FIG. 7 herein below, AM modulation is used for transmitting the data. This may also be referred to as on/off key modulation.

In operation, each of the transmit/receive circuits 606 operates in either transmit or receive mode. In the transmit mode, digital data received on a digital bus 603 is serially transmitted from one of the transmit/receive circuit 606 to the other one on the other of the dies 602. This is facilitated by driving the signal across capacitors 604 and 605 such that energy is coupled across the capacitors. This will allow energy to be transmitted on transmission lines 607 that couple the capacitors 604 and 605 together. A first side of capacitors 604 and 605 are with the input signal and energy associated therewith is coupled across the high voltage isolation boundary created by the capacitor and onto the transmission line 607. As will be described herein below, both of the transmit/receive circuits 606 and capacitors 604 and 605 are fabricated on an integrated circuit utilizing conventional processing techniques and available conductive layers that are shared with the transmit/receive circuits. There will be a loss associated with the coupling coefficient across the capacitor such that the amount of energy that can be delivered from the transmit/receive circuit 606 to the transmission line 607 is reduced and, further, there will be more loss at certain frequencies than others.

Figure 6A:
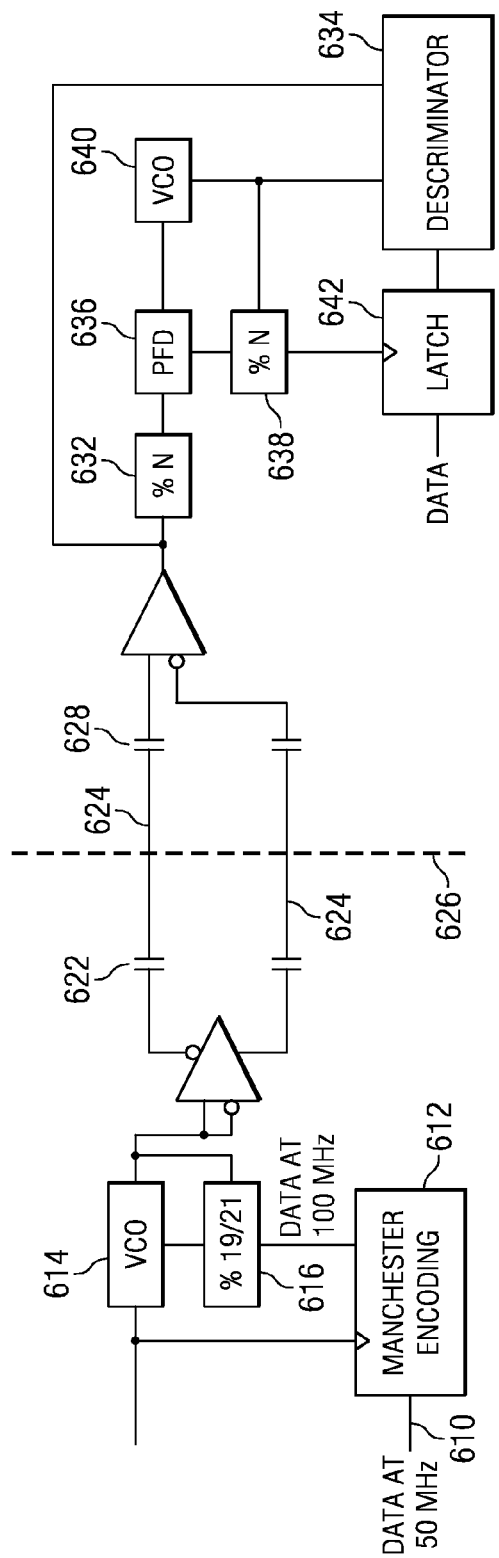
FIG. 6a illustrates a schematic block diagram of a circuit for providing the capacitive isolation link using frequency modulation.

Referring now to FIG. 6a, there is illustrated an alternate embodiment of the switching power supply utilizing frequency modulation to transmit data between a pair of chips over a capacitive isolation link 600. The description with respect to FIG. 6a is merely provided as an illustration of one potential embodiment of an FM circuit used for creating an RF isolation link, and one skilled in the art would realize the possibility of numerous additional embodiments. The data is input on a data bus 610 into a Manchester encoding circuit 612, a conventional data encoding circuit. Also input to the Manchester encoding circuit 612 is a clock signal. The clock signal is also input to a voltage controlled oscillator 614. Data is output from the Manchester encoding circuit 612 and applied to a divide circuit 616. A second input of the divide circuit 616 is connected to the output of the voltage controlled oscillator 614. The output of the divide circuit 616 is connected to a second input of the voltage controlled oscillator 614 to allow modulation thereof with the Manchester encoding circuit 616. The voltage controlled oscillator 614 outputs a frequency modulated signal representing the received data on bus 610 to a differential driver 618. The FM modulated signal is transmitted from the differential driver 618 through capacitors 622 onto transmission lines 624 passing across an interface 626 between either a first and second chip that are to be voltage isolated from each other or a first and second die.

The received data signal is capacitively coupled onto the receiver circuitry by a second pair of capacitors 628. The received signal passes through a differential receiver 630 whose output is applied to a Divide-by-N circuit 632 and a discriminator circuit 634. The output of the Divide-by-N circuit 632 is applied to the input of a PFD (phase/frequency detector) circuit 636. A second input to the PFD circuit 636 is provided by a second Divide-by-N circuit 638 having its input connected to the output of the voltage controlled oscillator 640. The input of the voltage controlled oscillator 640 is connected to the output of the PFD circuit 636. The output of the voltage controlled oscillator 640 is connected to a second input of the discriminator 634, this being a phase locked output phase locked to the data clock. The discriminator circuit 634 determines the data contained within the received signal responsive to the output of the voltage controlled oscillator 640 and the limiter 630. This data is provided to a latch circuit 636 having its clock input connected to the output of the Divide-by-N circuit 638. The data output of the receiver is provided from the latch circuit 642. Other types of modulation such as phase shift, on/off key modulation, etc. may be used.

Figure 7:
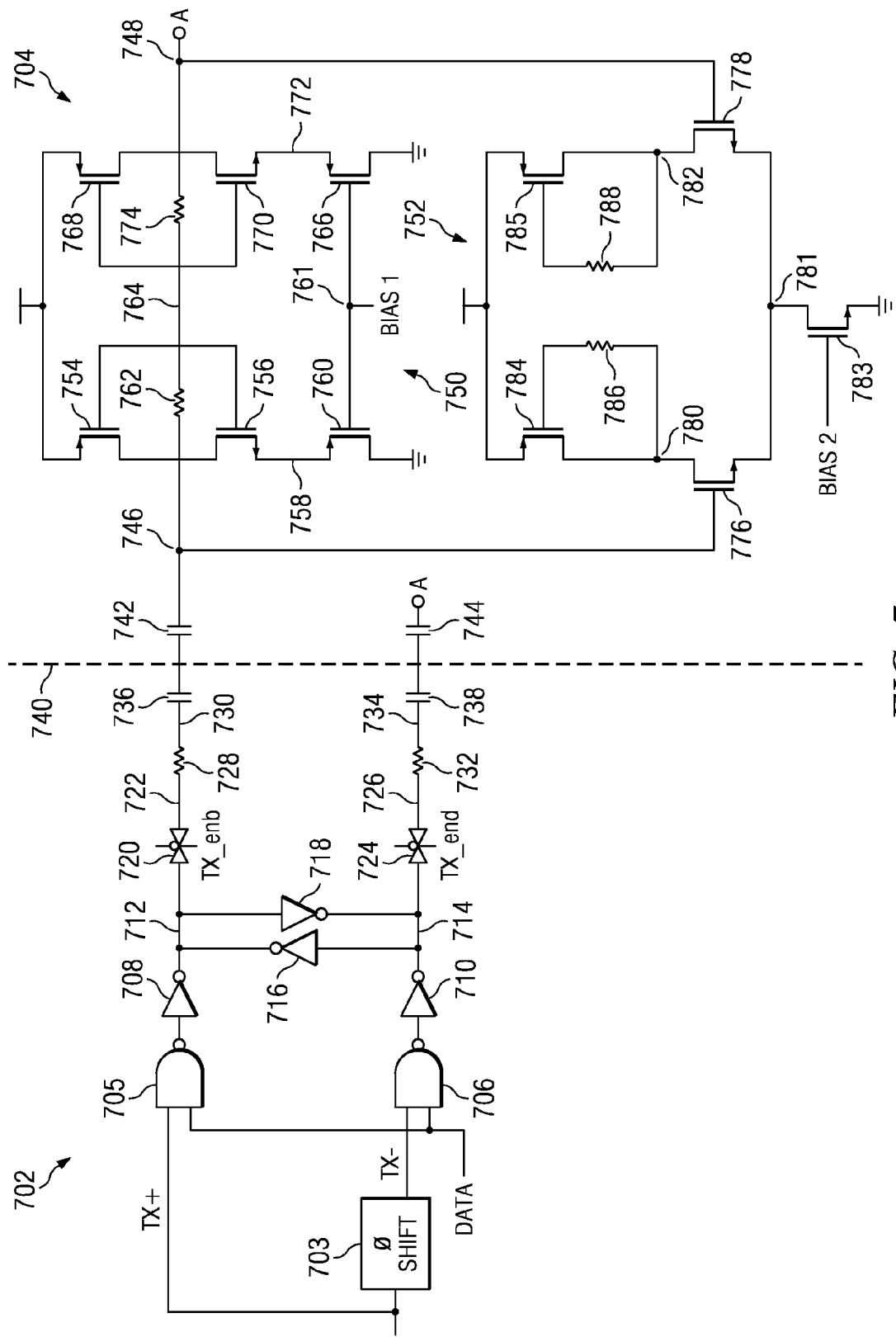
FIG. 7 illustrates a schematic diagram of the circuitry for providing the capacitive isolation link using amplitude modulation.

Referring now to FIG. 7 there is illustrated the preferred embodiment of the capacitive isolation link 600 of the present disclosure wherein amplitude modulation is used to transmit data over the link. The capacitive isolation link 600 consists of transmitter circuitry 702 and receiver circuitry 704 (a differential receiver). The transmitter circuitry 702 consists of a pair of NAND gates 705 (a differential driver) and 706 having first inputs connected to receive the data to be transmitted over the capacitive isolation link and a second input connected to receive an RF carrier signal (16 Hz). In addition to RF signals it is noted that other types of AC (alternating current) signals may be used for the transmissions. The RF carrier signal applied to NAND gate 706 first goes through a phase shifter 703 which phase shifts the RF carrier 180 degrees. The output of each of the NAND gates 705 and 706 are connected to the inputs of inverters 708 and 710 respectively. The output of each of the inverters 708 and 710 are connected to nodes 712 and 714, respectively. An inverter 716 has its input connected to node 714 and its output connected to node 712. A second inverter 718 has its input connected to node 712 and its output connected to node 714. A first transmission gate 720 has its input connected to node 712 and its output connected to node 722. A second transmission gate 724 has its input connected to node 714 and its output connected to node 726. A resistor 728 is connected between node 722 and node 730. A second resistor 732 is connected between node 726 and node 734. Node 730 is connected with a first isolation capacitor 736 and node 734 is connected with a second isolation capacitor 738. The transmission gates 720 and 724 are enabled when the differential driver circuit is transmitting data over the capacitive isolation link. The RF transmission signal is continually applied to one input of NAND gates 705 and 706. When a 1-bit is also transmitted on the other input of the NAND gates 705 and 706, the RF signal is transmitted over each of the transmission lines of the capacitive isolation link with the RF signal on the TX− line being 180 degrees out of phase with the RF signal on the TX+ line. When a 0-bit is applied to the inputs of NAND gates 705 and 706, no RF signal is transmitted over the capacitive link.

The capacitors 736 and 738 are connected across an isolation barrier 740. As is more fully described herein below, the isolation barrier may be between different chips or different dies on a single chip. Capacitors 736 and 738 connect across the isolation barriers with isolation capacitor 742 and 744, respectively. Capacitors 742 and 744 are associated with the receiver circuitry 704. Capacitor 742 connects with the receiver circuitry at node 746. Capacitor 744 connects with the receiver circuitry at node 748. The receiver circuitry comprises a differential receiver consisting of a bias and transient common mode clamp circuitry 750 for preventing the receiver node from floating and limiting the input common mode voltage to the receiver from exceeding the operating range of the receiver protecting a receiver amplifier 752. The receiver amplifier 752 detects a received signal. The bias and transient clamp circuitry 750 comprises a P-channel transistor 754 having its source/drain path connected between $V_{DD}$ and node 746. An N-channel transistor 756 has its drain/source path connected between node 746 and node 758. A P-channel transistor 760 has its source/drain path connected between node 758 and ground. A resistor 762 is connected between node 746 and node 764. The gates of each of transistors 754 and 756 are connected to node 764. The gate of transistor 760 connects with the gate of a transistor 766 which is connected to a circuit (not shown) providing a bias voltage BIAS 1. Transistor 768 is a P-channel transistor having its source/drain path connected between $V_{DD}$ and node 748. An N-channel transistor 770 has its drain/source path connected between node 748 and node 772. The P-channel transistor 766 having its gate connected with transistor 760 has its source/drain path connected between node 772 and ground. The gates of each of transistors 770 and 756 are connected to node 764. A transistor 774 is connected between node 748 and node 764. The bias and common clamp circuitry 750 clamps the receive input nodes to keep it from floating when no RF signal is applied and clamps the input voltage to the receiver.

The receiver amplifier 752 interconnects with the isolation capacitors at nodes 746 and 748 respectively. These nodes are connected with the gates of N-channel transistors 776 and 778. Transistor 776 is connected between nodes 780 and 781. Transistor 778 has its drain/source path connected between node 782 and node 781. A transistor 783 has its drain/source path connected between node 781 and ground. The gate of transistor 783 is connected to bias circuitry (not shown) providing a bias voltage BIAS 2. A P-channel transistor 784 has its source/drain path connected between $V_{DD}$ and node 780. A transistor 785 has its source/drain path connected between $V_{DD}$ and node 782. A resistor 786 is connected between the gate of transistor 784 and node 780. A resistor 788 is connected between the gate of transistor 785 and node 782. The receive signals over the capacitive link can be detected at either of nodes 780 and 782 and the received signal are offset from each other by 180 degrees.

Figure 8:
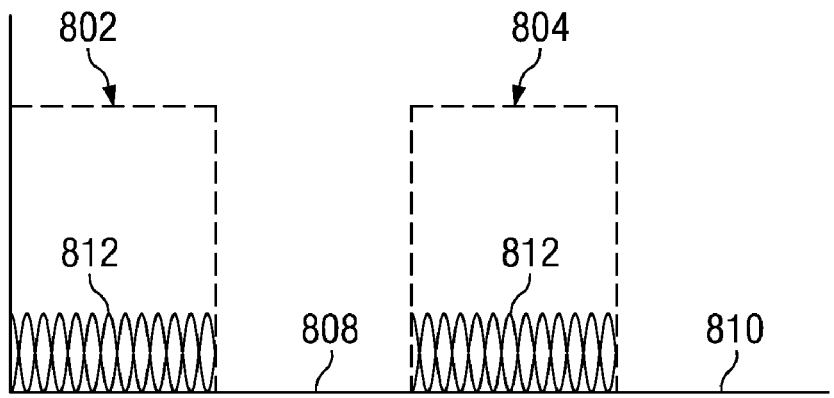
FIG. 8 illustrates the waveforms present on the transmit side of the capacitive isolation link of FIG. 7.
Figure 8A:
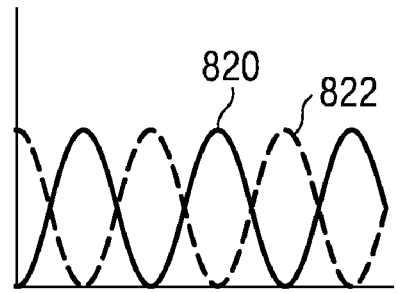
FIG. 8a illustrates a zoom in view on the transmit side of the waveform of FIG. 8.
Figure 9:
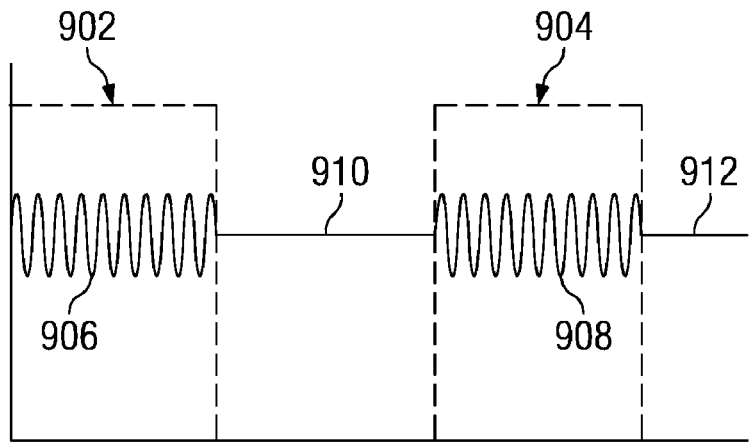
FIG. 9 illustrates the waveforms present on the receiving side of the capacitive isolation link of FIG. 7.

Referring now to FIGS. 8, 8a and 9, there are illustrated the waveforms and data provided at the transmission side (FIGS. 8 and 8a) of a capacitive isolation link 600 and the receive side (FIG. 9) of the capacitive isolation link. On the transmission side illustrated in FIG. 8, the data 800 is either transmitted as a one bit (high) or zero bit (low). A one bit pulse is indicated at 802 and 804. A zero bit pulse is indicated at 808 and 810. The transmit data provided to the capacitive link is illustrated by the waveform 812. The transmit data waveform represents the 1 GHz RF carrier signal. When a logical "1" data bit is being transmitted and the data signal is high, the presence of the RF carrier is provided at the transmit data output. The RF carrier signal can be of any frequency. The use of different frequencies enables the provision of lower power circuitries with lower frequencies. When a logical "0" bit is being transmitted, the signal is virtually zero at the transmit data output. Thus, whether a logical "1" bit or a logical "0" bit is transmitted is indicated either by the presence or absence of the RF carrier signal.

FIG. 8a illustrates the manner in which the wave form 812 is transmitted on each of the transmission lines of the capacitive link 600. A first RF signal 820 comprises the information transmitted on the TX+ line of the capacitive link from the differential driver. The wave form 822 comprises the inverted format of the RF signal on the TX− line that is 180 degrees out of phase with signal 820.

FIG. 9 illustrates the waveforms associated with the receiver 704. The received data for the logic "1" bit is represented at points 902 and 904 and indicates the two 1 GHz RF carrier pulses transmitted from the transmitter 702 of the capacitive isolation link 600. The received pulses are amplified by the amplifier 752 such that the pulses are represented by the amplified waveform pulses 906, 912 and 408. The detector data output rises to $V_{DD}$ at points 91 and 912 when no RF carrier signal is detected indicating a logical "0." When an RF carrier signal is detected, the output of the detector 706 begins to vary at points 906 and 908 indicating a logical "1," this being the result of an increase in the NMOS current in transistors 776 and 778.

Figure 10:
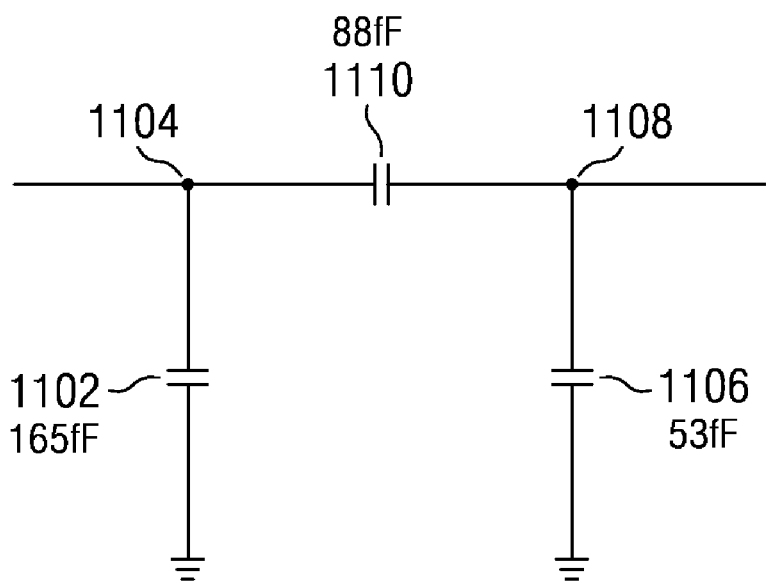
FIG. 10 illustrates a model of one of the capacitive isolation links.

Referring now to FIG. 10, there is illustrated a model for the capacitors 716, 720, 722 and 726. Capacitor 1102 represents a 165 fF capacitor connected between node 1104 and ground. Capacitor 1106 represents a 53 fF capacitor connected between node 1108 and ground. Connected between node 1104 and node 1108 is represented by an 88 fF capacitor 1110.

Figure 11:
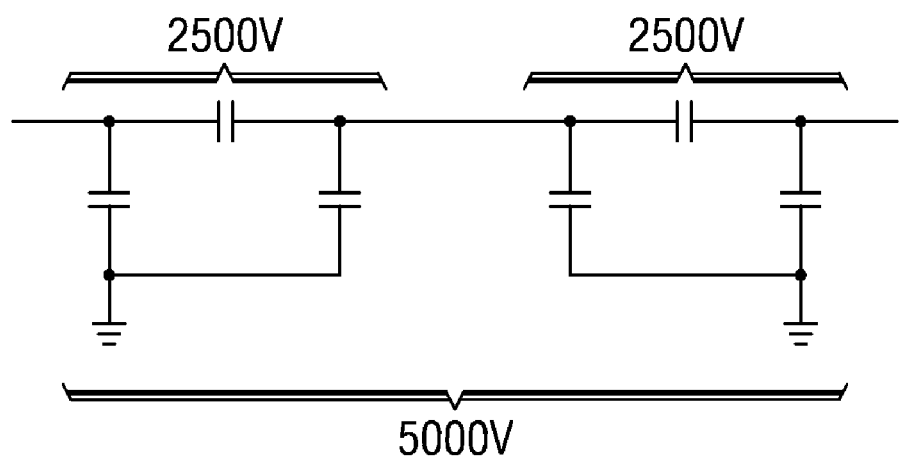
FIG. 11 illustrates the voltages across each capacitor included within a capacitor isolation link and across the entire capacitive isolation link.

Using the RF isolation links 600 described above, voltage isolation of up to 5,000 volts may be achieved, 2,500 volts for each side. Thus, as illustrated in FIG. 11, the RF isolation circuit 602 may provide 5,000 volts of isolation between a first chip 602a and a second chip 602b. While the voltage between the input terminals of the chip 602a will be zero volts, and the voltage between the input terminals of the chip 602b will also be zero volts, the total voltage difference between the two chips may be 5,000 volts with a 2,500 voltage difference across each of the capacitors associated with the interfaces to the capacitive isolation circuit on each chip 602.

Figure 12A:
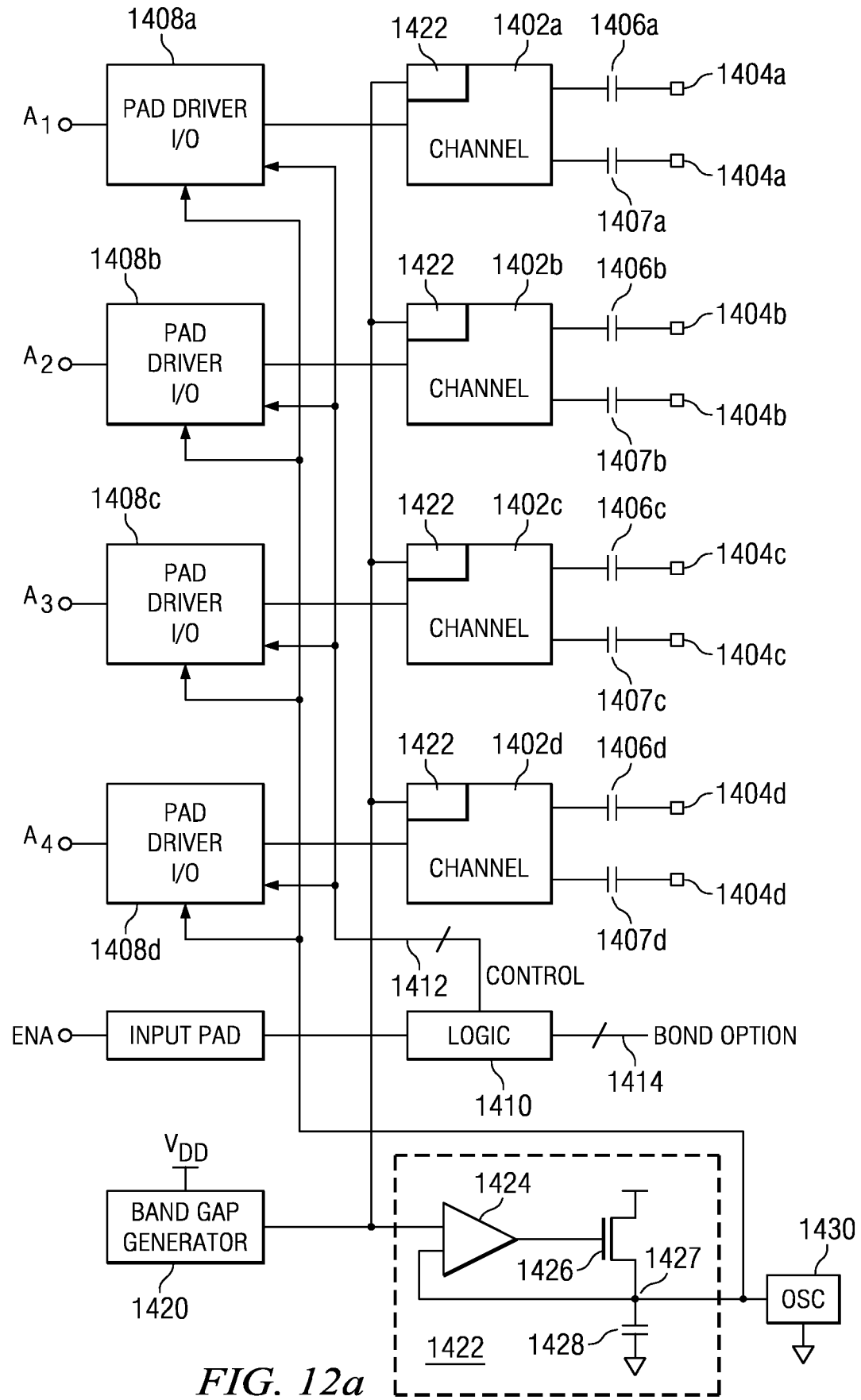
FIG. 12a is a block diagram illustrating the circuitry included within a chip on one side of the capacitive isolation link for providing multiple isolation link channels.

Referring now to FIG. 12a, there is illustrated a block diagram of the structure of an interface of a single chip 602 including a portion of a plurality of channels 1402 including the capacitive isolation link of the present disclosure. Each channel 1402 consists of the a pair of capacitors 1406 and 1407 and transmit and/or receive circuitry described with respect to FIG. 7. Data may be either input or received at the interface 1404 of the capacitive isolator. Each channel 1402 is interconnected with a pad driver 1408 that either drives transmitted data from the pad driver over channel 1402 to be output over the interface 1404 or drives received data to the associated pad of the chip 602. The manner in which data can be either transmitted or received over a particular channel 1402a is controlled on the chip 602 by logic circuitry 1410 providing control over various control lines 1412. The manner in which the logic control 1410 controls whether a channel is used for transmitting or receiving is set by input bond pad options 1414. Thus, in this embodiment, data is received as either a logic "1" or a logic "0" and the associated capacitive isolator is driven, when a pad is configured as a transmitter, (or not driven) accordingly. For received data on the associated capacitive isolator, when configured to receive data, the output of the pad is either high or low.

An oscillator circuit 1430 is also associated with all of the channels of the interface. A band gap generator 1420 is provided on-chip and connected to $V_{DD}$ to provide a band gap reference voltage to a regulator circuit 1422. While the description with respect to FIG. 14a only illustrates a single voltage regulator 1422, it will be noted that a separate voltage regulator 1422 will be associated with each of the channels of the interface for noise purposes. The voltage regulator 1422 consists of an amplifier 1424 having one input connected to the output of the band gap generator 1420. The output of the amplifier 1424 is connected to the gate of a transistor 1426. The drain-source path of the transistor 1426 is connected between $V_{DD}$ and a node 1427. Node 1427 is also connected to the second input of the differential amplifier 1424. A capacitor 1428 is connected between node 1422 and ground. Each of the channels 1402a, 1402b, 1402c and 1402d has a regulator 1422 associated therewith. Connected to node 1427 is an oscillator circuit 1430.

Figure 12B:
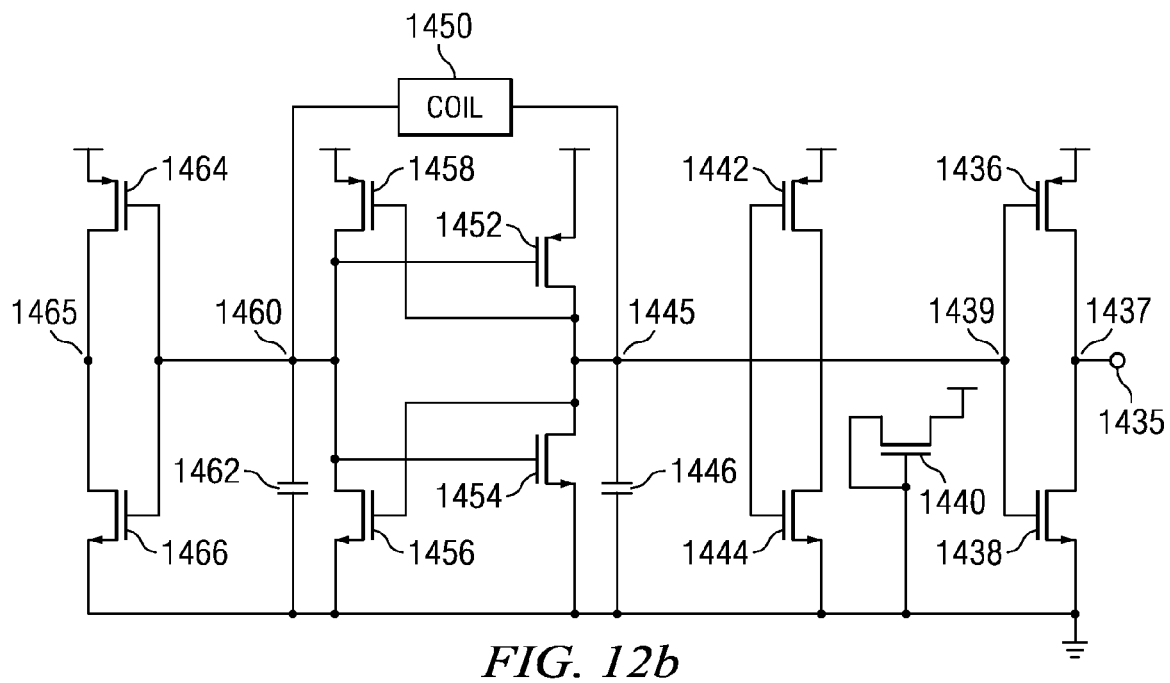
FIG. 12b is a schematic diagram of an oscillator circuit.
Figure 14A:
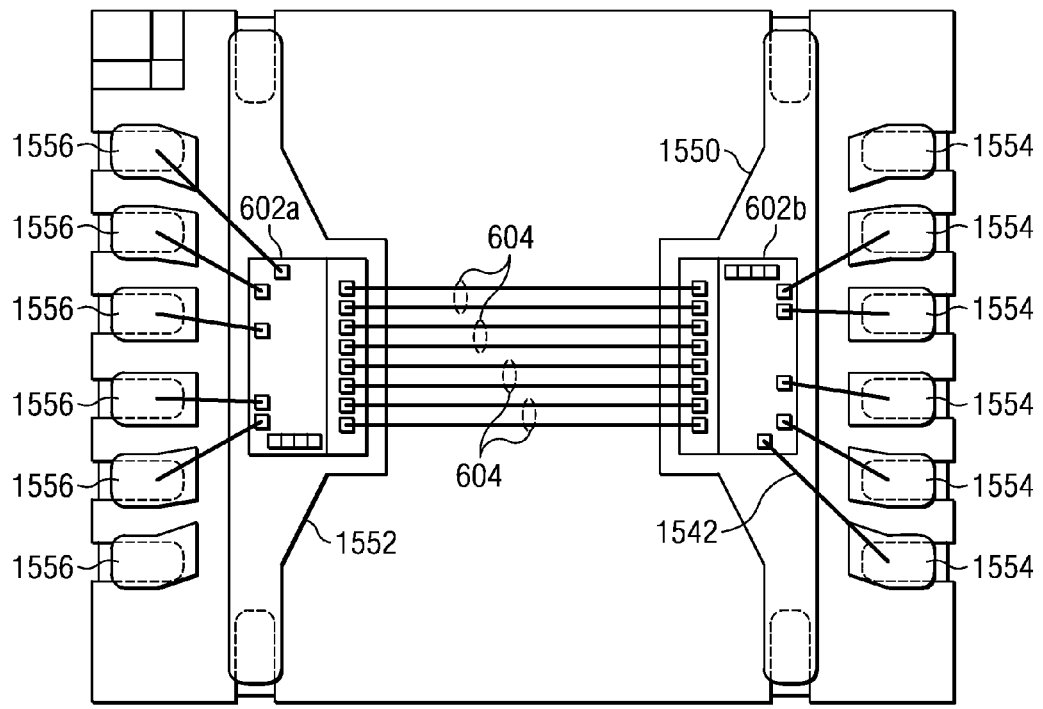
FIG. 14a illustrates the capacitive isolation link within a chip package.

FIG. 12b illustrates the oscillator circuit 1430 of FIG. 14a. The output 1435 is connected to node 1437 between transistor 1436 and transistor 1438. The drain-source path of transistor 1436 is connected between $V_{DD}$ and node 1437. The drain-source path of transistor 1438 is connected between node 1437 and ground. The gates of transistor 1436 and 1438 are connected to each other through a node 1439. A transistor 1440 has its gate connected to ground and its drain-source path connected between $V_{DD}$ and the gate of transistor 1440. Node 1439 also interconnects transistor 1442 and transistor 1444. The drain-source path of transistor 1442 is connected between $V_{DD}$ and node 1439. The drain-source path of transistor 1444 is connected between node 1439 and ground. The gates of transistors 1442 and 1444 are interconnected with each other via node 1445. A capacitor 1446 is connected between node 1445 and ground. Node 1445 is connected to a first terminal of coil 1450. The second terminal of coil 1450 interconnects with the circuit via node 1460. Transistors 1452 and 1454 are interconnected via node 1445. The drain-source path of transistor 1452 is connected between $V_{DD}$ and node 1445. The drain-source path of transistor 1454 is connected between node 1445 and ground. The gates of both transistor 1452 and 1454 connect to node 1460. Transistors 1458 and 1456 are interconnected via node 1460. The drain-source path of transistor 1458 is connected between $V_{DD}$ and node 1460. The drain-source path of transistor 1456 is connected between node 1460 and ground. The gates of transistors 1458 and 1456 connect to node 1445. The capacitor 1462 is connected between node 1460 and ground. Also connected to node 1460 are the gates of transistors 1464 and 1466. The drain-source pathway of transistor 1464 is connected between $V_{DD}$ and node 1465, and the drain-source pathway of transistor 1466 is connected between node 1465 and ground. This oscillator therefore comprises a conventional LC oscillator.

Figure 12C:
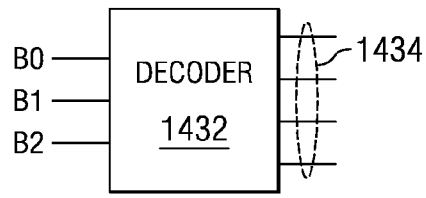

Referring now to FIG. 12c, there is illustrated one embodiment of the circuitry which might be incorporated within the logic circuit 1410. In this embodiment, the logic circuit 1410 includes of a decoder 1432. The decoder has a total of three bond pad inputs B0, B1 and B2 for receiving the indication of the version of the chip being implemented. The outputs 1434 of the decoder are input to the appropriate channels such that the channel may be configured in either a transmission or reception mode.

Figure 13:
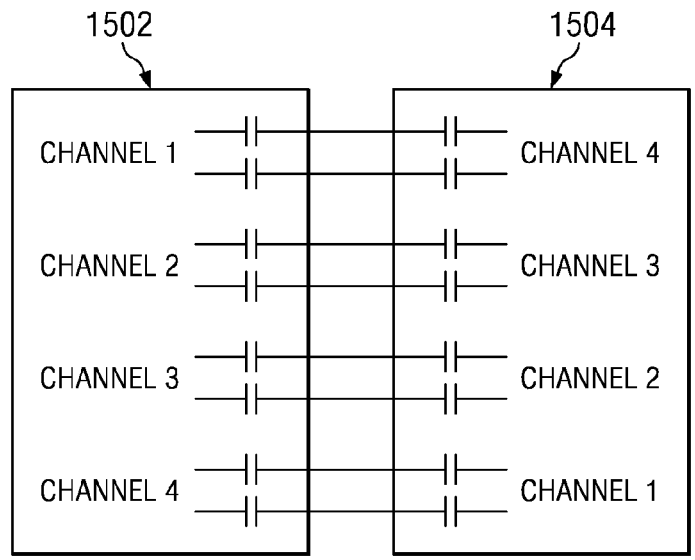
FIG. 13 illustrates a pair of chips within a single package including four separate channels for providing four isolated digital data links.

Referring now also to FIG. 13, there is illustrated the manner in which the single chip design described in FIG. 7 can be used to facilitate an entire capacitive isolation circuit including four separate capacitively isolated channels. A first chip 1502 is reversed such that the output channels 1402 between the first chip 1502 and the second chip 1504 are merely reversed. Thus, when viewing the chip 1502 from top to bottom of chip one, channel one is at the top, channel two is second, channel three is third and channel four is last. For the second chip 1504, the channels run in the opposite direction with channel one beginning at the bottom and channel four being at the top. The physical design of chip 1502 and chip 1504 are the same. Chip 1504 is merely reversed to facilitate the three versions of the chip as described below. Three different bond option versions may be selected for input to the logic circuit 1410 of the package containing the first chip 1502 and the second chip 1504 utilizing the decoder circuit 1432. Referring now to the Table 1, there are illustrated the three separate versions of operation for both the first chip 1502 and the second chip 1504 and the indication of whether the channel comprises a transmit or receive channel in the associated version.

TABLE 1

| Version | Chip | Ch. 1 | Ch. 2 | Ch. 3 | Ch. 4 |
|---------|------|-------|-------|-------|-------|
| 1 | 1 | Tx | Tx | Tx | Tx |
| 2 | 1 | Tx | Tx | Rx | Rx |
| 3 | 1 | Tx | Rx | Rx | Rx |
| 1 | 2 | Rx | Rx | Rx | Rx |
| 2 | 2 | Tx | Tx | Rx | Rx |
| 3 | 2 | Rx | Tx | Tx | Tx |

As can be seen, the associated chips 1502 and 1504 channels correspond, such that when a channel on one chip is transmitting or receiving, the corresponding channel on the other chip is doing the opposite.

Referring now to FIG. 14a, there is illustrated the capacitive isolation link 600 within a chip package. As discussed previously in FIG. 15, there are illustrated chips 1602a and 1602b interconnected by four separate channels 604. Each channel 604 is represented by two bond wires interconnecting the capacitors (not shown) within each of chips 1602a and 1602b. Each of chips 1602a and 1602b are also connected to various bond pads 1504 within the package by a connection line 1542 that provide connections to the other electronic circuitry.

The embodiment of FIG. 14a is referred to as a "split lead-frame" package. This is facilitated with the use of a lead frame 1550 on one side thereof and a lead frame 1552 on the other side thereof. Lead frame 1550 is interfaced with terminals 1554 and lead frame 1550 is interfaced with terminals 1556. During fabrication, the lead frames 1550 and 1556, which are not electrically connected to each other, provide support for the chips 602a and 602b, respectively. When the chips 602a and 602b are bonded onto their respective portions of the lead frame, they are then bonded to the appropriate terminals 1554 and 1556 and then the bond wires 604 disposed therebetween. The entire package is then encapsulated in a conventional encapsulate. Thus, the bond wires 604 each comprise a high frequency transmission line disposed between the two chips, each transformer associated with two band wires that provide a "two-wire" transmission line.

Figure 14B:
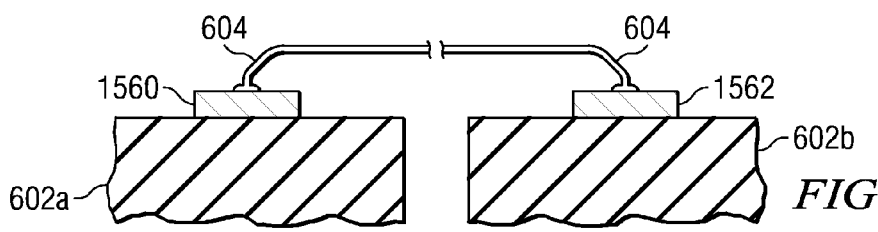
FIG. 14b illustrates a side view of a bond wire.

Referring now to FIG. 14b, there is illustrated a side view of one of the bond wires 604. It can be seen that the substrate associated with the die 602a has disposed thereon a bonding pad 1560 and the die 602b has disposed thereon a bonding pad 1562. The bond wire 604 is bonded to the pad 1516 on one side with a conventional bond and also to the pad 1562 on the die 602b. The length of the bond wire 604 is a fraction of a wavelength at the 2.4 GHz frequency. However, it will be inductive in nature and will have distributed inductance and capacitance associated therewith. As such, the transmission characteristics of the bond wire can affect the transmission of information between the two dies 602a and 602b. As noted herein above, the input impedance to each of the pads 1560 is on the range of 500 ohms. Thus, for ideal transmission of the information, there might be some matching circuitry required in addition to just the bond wires 604 forming the two-wire transmission line, although that has not been set forth herein.

Figure 15:
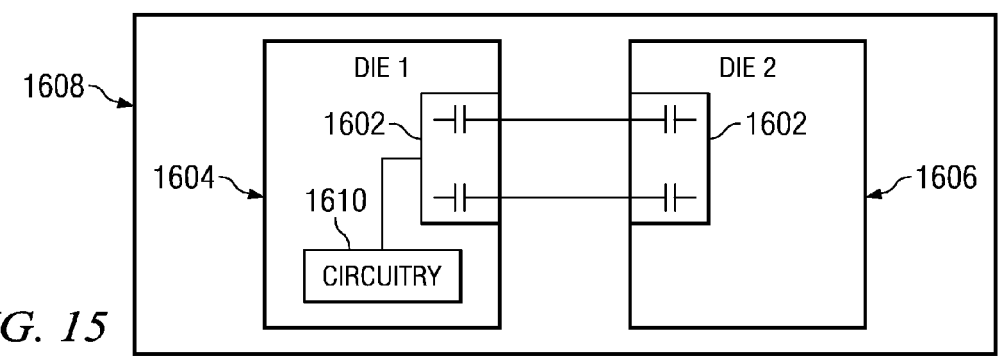
FIG. 15 illustrates an integrated capacitive isolation link in a single package including two dies.

Referring now to FIG. 15, there is illustrated the manner in which the capacitive isolation link 600 represented as capacitive isolation circuitry 1602 may be integrated into two separate multi-functional dies, 1604 and 1606, within a single package 1608. The capacitive isolation circuitry 1602 may provide isolation between components on two separate dies 1604 and 1606. Associated with one or both of the dies could be additional circuitry 1610 such as a microcontroller or other electronic component. This additional circuitry would be isolated from components in the other die via the capacitive isolation link 1602.

Figure 15A:
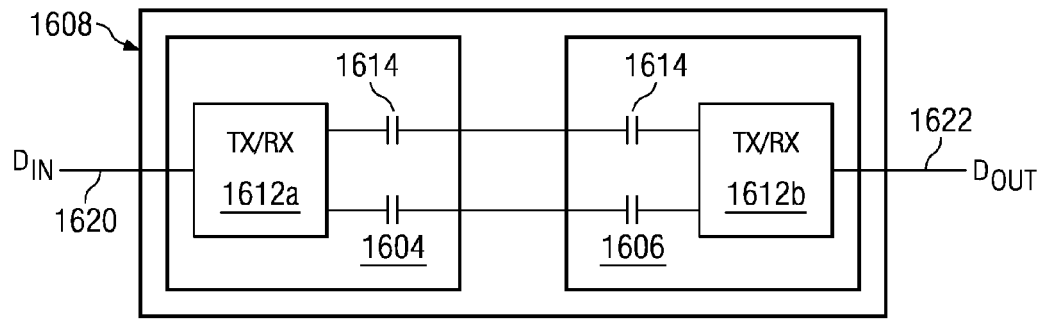
FIG. 15a illustrates an integrated capacitive isolation link in a single package having a digital input and a digital output.

Referring now also to FIG. 15a, when a capacitive isolation link 600 is integrated onto two separate dies 1604 and 1606 in a single package 1608. The isolation interface 1602, which includes the transceivers 1612 and the capacitors 1614, may be used to provide simply a digital IN, digital OUT package 1608. In this embodiment, the digital input 1620 is applied to a first transceiver 1612a. Alternatively, the digital input 1620 could be applied to digital circuitry connected to the transceiver 1612a. The isolation circuit operates in the manner described herein above and a second digital output 1622 is provided from transceiver 1612b or associated digital circuitry.

Figure 15B:
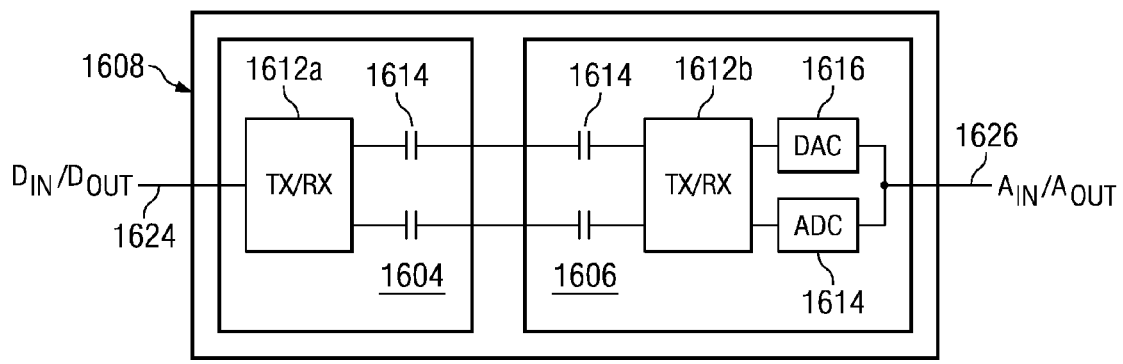
FIG. 15b illustrates an integrated capacitive isolation link in a single package including a digital input/output and an analog input/output.

Referring now to FIG. 15b, rather than providing a solely digital input/digital output circuit, a single package 1608, including first and second dies 1604, 1606 implementing the capacitive isolation circuit described herein above, may provide a circuit with a digital input/output and an analog input/output. In this case, a digital input/output 1924 would connect with transceiver 1612a or digital circuitry of a first die 1604. The first die 1604 is coupled with the second die 1606 via the described capacitive isolation link, and the transceiver 1612b is coupled to an analog input/analog output 1626 through a data converter, either an ADC 1614 or a DAC 1616, depending upon the direction.

Figure 15C:
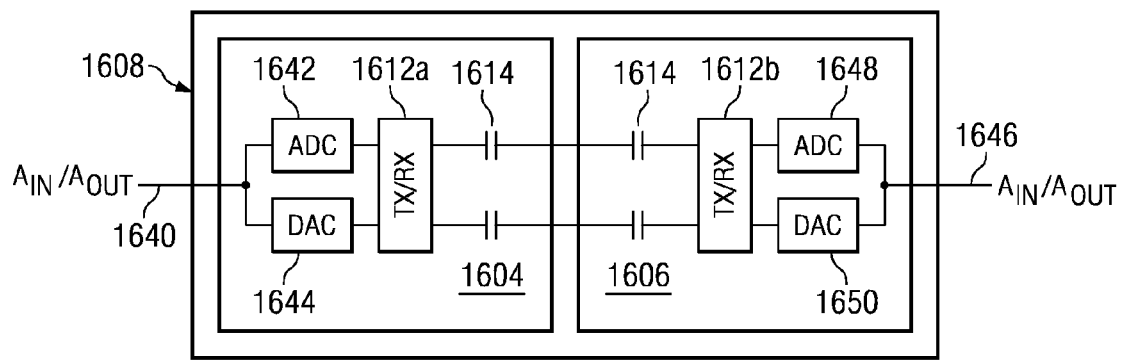
FIG. 15c illustrates an integrated capacitive isolation link in a single package including an analog input/output and an analog input/output.

Referring now to FIG. 15c, a single package 1908, including first and second dies 1604, 1606 implementing the RF isolation circuit described herein above, may provide a circuit with an analog input/output and on one side and an analog input/output on the other side. In this case, an analog input/output 1640 would connect to an A-D converter 1642 and a D-A converter 1644 and then to the transceiver 1612a or digital circuitry of a first die 1604. The first die 1604 is coupled with the second die 1606 via the described RF isolation link, and the transceiver 1612b is coupled to an analog input/output 1646 via an A-D converter 1648 and D-A converter 1650. In this way, analog signals may be transmitted in either direction across the single package 1608.

Figure 16A:
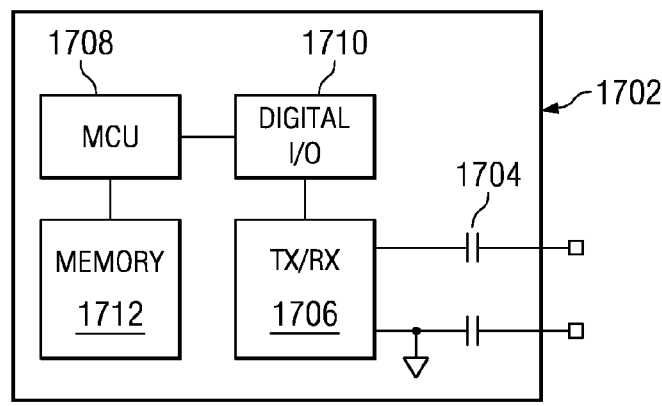
FIG. 16a illustrates a capacitive isolation link integrated with a microcontroller.

Referring now to FIG. 16a, there is illustrated a chip 1702 including a portion of the capacitive isolation link described herein above. The chip 2002 includes a capacitive link 1704 and the transmit and receive circuitry 1706 of the capacitive isolation link 600. The capacitive isolation link 600 consisting of the transceiver 1706 and the capacitive link 1704 is integrated with a microcontroller unit 1708 through a digital input/output 1710. A memory 1712 stores operating instructions and data needed by the microcontroller unit 1708. The chip 1702 would be able to interconnect with a second chip that included an interface consisting of a capacitive link 1704 and transceiver 1706 similar to that included within the chip 1702. By interconnecting to such chips, the microcontroller 1708 and the interconnected chip would be voltage isolated from each other via the complete capacitive isolation link between them.

The transmit and receive circuitry 1706 is part of the I/O interface for the integrated circuit. One type of integrated circuit that provides the overall functionality of that illustrated in FIG. 17a is a conventional microcontroller unit of the type C8051FXXX, manufactured by the Silabs, Inc. This chip provides onboard processing through the MCU 1708, interface to the analog domain and interface to the digital domain. This integrated circuit also has the ability to configure the various outputs and, as such, a digital output could be provided on a serial interface for driving the transmit/receive circuitry 1706 or receiving the serial data therefrom.

The process of fabricating the MCU 1708, memory 2012 and the digital I/O 1710, in addition to the various analog-to-digital data converters or digital-to-analog data converters is fairly complex. As such, the transmit and receive circuitry 1706 and the capacitive link 1704 must be compatible with the process rather than making the process compatible with the capacitive link. As will be described herein below, there are a plurality of metal layers utilized to fabricate various interconnects associated with fabrication of the integrated circuit. By utilizing the various metal layers that are already present in the fabrication process, the two sides of the capacitive link 1704 can be fabricated and isolated from one another with sufficient isolation to provide adequate over voltage protection.

Figure 16B:
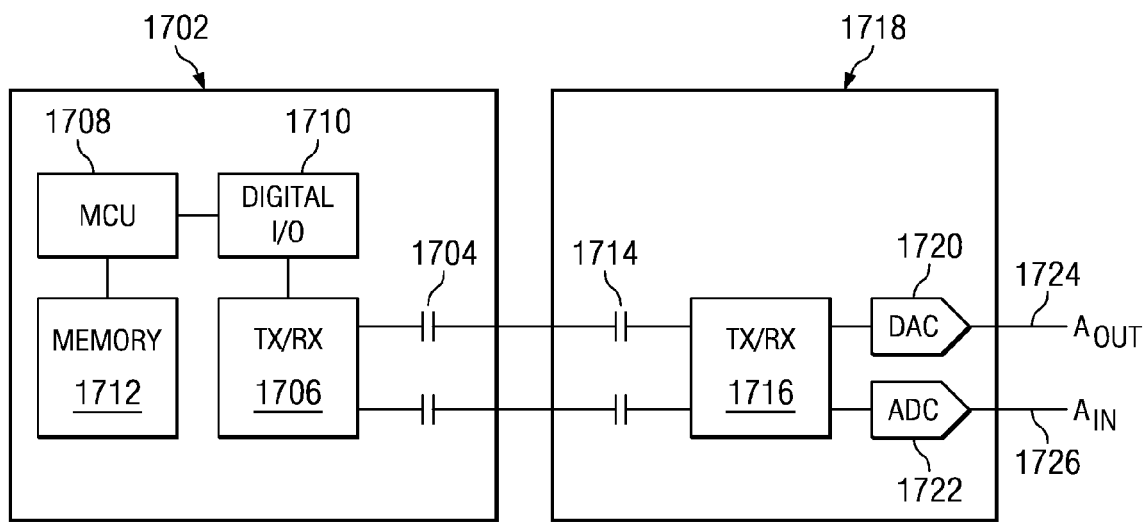
FIG. 16b illustrates the capacitive isolation link integrated with a microcontroller interconnected to a second chip providing both analog input and analog output.

One example of this is illustrated in FIG. 16b, wherein the chip 1702 including an capacitive isolation link consisting of capacitors 1704 and transceiver 1706 is integrated with a microcontroller unit 1708 through a digital input/output 1710. The MCU 1708 also includes an associated memory 1712. In this case, the first portion of the capacitive isolation link consisting of a capacitors 1704 and transceiver 1706 is interconnected with a second portion of the capacitive isolation link consisting of capacitors 1714 and transceiver 1716. In this case, the chip 1718 including the second portion of the capacitive isolation link includes a digital-to-analog converter 1720 and an analog-to-digital converter 1722 for converting the digital output of the transceiver 1716 of the capacitive isolation link into an analog output and for converting received analog inputs into digital inputs. The chip 1718 enables both the output of an analog signal at analog output 1724 and the input of analog signals at analog input 1726. These analog signals may then be used in any desired fashion by a circuit designer.

Figure 17:
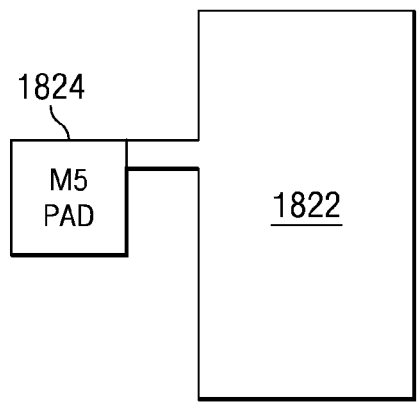
FIG. 17 illustrates a structure of one plate of a capacitor in an integrated circuit.
Figure 18:
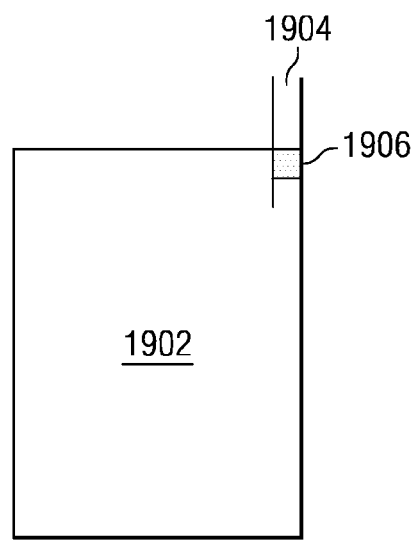
FIG. 18 illustrates a structure of a second plate of a capacitor in the integrated circuit.

Referring now to FIGS. 17, 18, 19a and 19b, there is illustrated the structure of the capacitors of the capacitive isolation link integrally formed on a CMOS device. Each plate of the capacitor is integrated as part of one of the chips or dies including the capacitive isolation link. Referring more particularly to FIGS. 17 and 18, there are illustrated the plates forming each plate of a capacitor included within the capacitive link. A first plate 1822 is formed within the fifth metal layer of a chip referred to as the "metal five" layer. The plate 1822 is connected with a pad 1824 located on the metal five layer.

Referring now to FIG. 18, there is illustrated the components of the second plate of a capacitor of the capacitive link wherein a second plate 1902 is used to form the second plate of the capacitor. The plate 1902 is located on the second metal layer of a chip referred to as the "metal two" layer. The metal layers are conductive layers of the substrate. The plate 1902 is interconnected to plate 1904 within the metal five layer via conductive a via 1906. Each of the capacitors included within the capacitive isolation link are constructed in a similar manner.

Figure 19A:
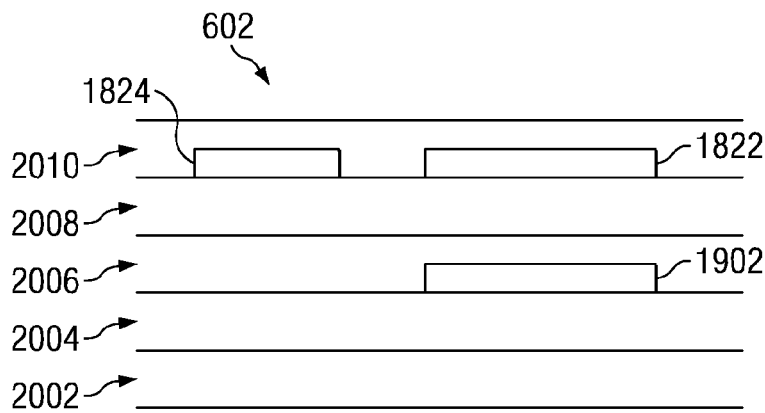
FIG. 19a illustrates a side view of the capacitor structure with the integrated circuit.

Referring now to FIG. 19a, there is illustrated a side view of a chip 602 containing a capacitor structure as described with respect to FIGS. 17 and 18. The chip 602 includes a substrate layer 2002 containing the transceiver circuitry of the capacitive isolation link and any electronic circuitry integrated with the capacitive isolation link as discussed previously. The metal one layer 2004 resides upon the substrate 2002. On top of the metal one layer is the metal two layer 2006 containing the capacitor plate 902 interconnected by vias to the terminals 1904 (not shown) in the metal five layer 2010. The metal five layer 2010 resides over the metal two layer 206. The metal five layer 2010 contains the other portion of the capacitor, including the bond pad 1824 and the second plate 1822 of the capacitor. The metal one layer 2004 is utilized primarily to provide interconnects to the remaining circuits. However, the process uses all five metal layers for the various interconnects. For the purposes of over-voltage protection, it is desirable to separate the plates of the capacitors represented by plates 1902 and 1822 by as much distance as possible; realizing that the material disposed therebetween is silicon dioxide, a dielectric. In an alternative embodiment the plate 1822 could be placed below the pad 1824 or alternative the plate 1822 could act as both the plate of the capacitor and as the pad 1824.

Figure 19B:
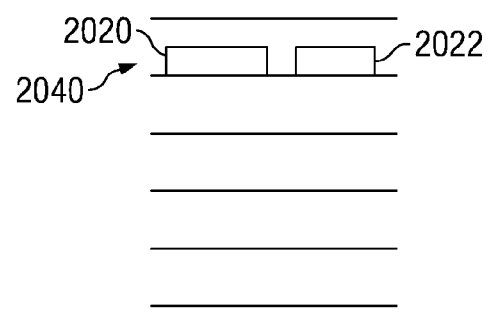
FIG. 19b illustrates a side view of a horizontal capacitor structure.

FIG. 19b illustrates a side view of a horizontal capacitor. The horizontal capacitor consists of a first plate 2020 and a second plate 2022 that are each on the same layer 2040 of the integrated circuit. This type of capacitor may also be used in the capacitive isolation link. Alternatively, a combination of horizontal and vertical capacitors (FIG. 19a) may be used.

Figure 20:
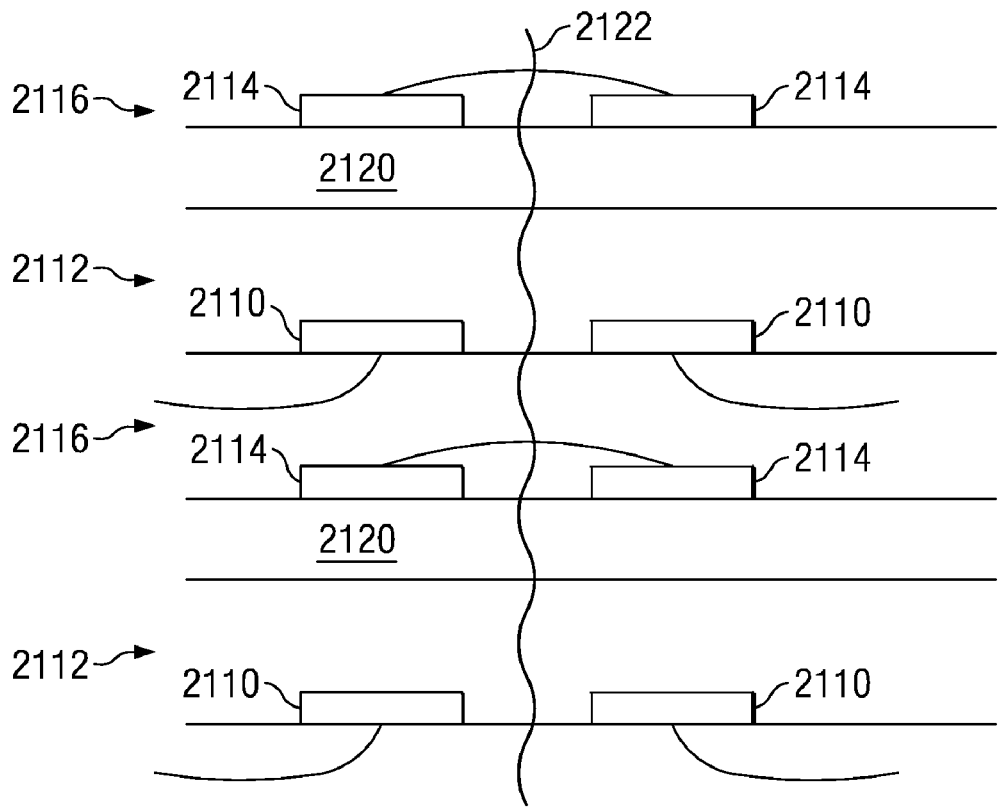
FIG. 20 illustrates a side view of the capacitor isolator link in the integrated circuit.

Referring now to FIG. 20, there is illustrated a side view of the various capacitors 2108 having a first plate 2110 within a metal five layer 2112 and a second plate 2114 within a metal two layer 2116. The first plates 2110 and second plates 2114 are separated by a dielectric layer 2120. Each pair of capacitors 2108 associated with one side of the capacitive isolation connection may be located in a same die or in separate dies separated at line 2112. In either case, the break down voltage across the set of each pair of capacitors in series is divided across each capacitor in the series connected pair. Thus, for a total voltage of 5,000 volts, a total of 2,500 volts would be distributed across each of the capacitors 2108.

Figure 21:
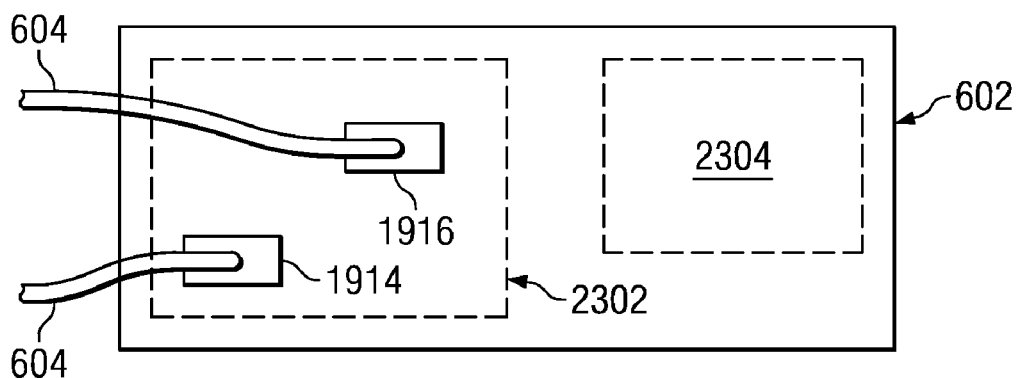
FIG. 21 illustrates a chip including a capacitive isolation link.

Referring now to FIG. 21, there is illustrated a chip 602 including a capacitive isolation link according to the present disclosure. The area of the chip 602 would be divided into at least two sections. A first section 2302 would contain the circuitry for providing the transformer for electromagnetically coupling with a transformer on another chip to provide the voltage isolation link between the chips. The remaining electronic circuitry of the chip would be located in a separate area 2304 and would include the transmitter and receiver circuitry of the voltage isolation link associated with the transformer as well as any electronic circuitry that would be integrated with the voltage isolation link, such as a microcontroller or other type of electronic device. This would be repeated for multiple voltage isolation links for additional data paths. Additionally, it is noted that the layout is such that the area 2302 that contains the transformer on the upper surface thereof will have provided the pads 2116 in the center of the coil 2118 and the pad 2114 on the exterior thereof. The pad 2114 is located proximate the edge of the chip such that the bond wire 604 can be bonded thereto. Additionally, the pad 2116 is on the same surface as the pad 2114 such that the bond wire 604 associated therewith can be connected thereto. As such, there are no runs required to connect to the pad 2116 in a coil that would be required to run through other layers and run closer to the coils therein at right angles thereto. The bond wire 604 associated therewith will actually be disposed farther away from the actual metal runs 2102 associated with the coil 1818. An additional area could be included on the chip for additional electronic circuitry to be voltage isolated via a voltage isolation link on the same chip.

FIG. 22 illustrates the overall structure of the capacitive isolation link implemented on a chip 2402. Four separate interface connections 2404 provide connection of each of the four channels of the RF isolation link integrated into the chip 2402. Each of the four interfaces 2404 is linked with the oscillator 2406 and coil 2408. Connected to each of the interfaces 2404 are the transformers 2410 consisting of a first coil 2412 and a second coil 2414. Coil 2414 connects with the interface 2404 to provide interconnection with an external chip via the RF isolation link. Coil 2412 interconnects to bond pads 2416. It is noted that the channel one and channel four coils 2414 each include two separate bond pads 2416. However, the channel two and three coils 2414 each have a bond pad within the interior of the coil but share the external bond pad 2416x between channels two and three. Pad circuitry 2418 is associated with the oscillator circuit 2406 and the coils 2410. The pad circuitry 2418 is interconnected with the remainder of the circuitry on a chip 2402 via a number of bond pads. The bond pads comprise a ground bond pad 2418, a $V_{DD}$ bond pad 2420, two enable bond pads 2422, four output bond pads 2424 and four input bond pads 2426, one for each channel.

It will be appreciated by those skilled in the art having the benefit of this disclosure that this capacitive isolator provides a voltage isolator link in an integrated circuit. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

The invention claimed is:

1. An integrated circuit having voltage isolation capabilities, comprising:
   a first area of the integrated circuit containing functional circuitry, the functional circuitry located in a substrate of the integrated circuit; and
   a second area of the integrated circuit containing integrated capacitive isolation circuitry for voltage isolating the functional circuitry, the capacitive isolation circuitry located in conductive layers of the integrated circuit wherein the capacitive isolation circuitry further comprises:
   a first voltage isolation capacitor including:
      a first plate comprising a first plate of the first voltage isolation capacitor located on a first conductive layer, the first plate connected to the functional circuitry; and
      a second plate comprising a second plate of the first voltage isolation capacitor located on a second conductive layer and capacitively coupled thereto, the second plate connected to the a first output of integrated circuit; and
   a second voltage isolation capacitor including:
      a third plate comprising a first plate of the second voltage isolation capacitor located on the first conductive layer, the first plate connected to the functional circuitry;
      a fourth plate comprising a second plate of the second voltage isolation capacitor located on the second conductive layer and capacitively coupled thereto, the fourth plate connected to a second output of the integrated circuit; and
   transceiver circuitry connected to the first plate of the first voltage isolation capacitor and the third plate of the second voltage isolation capacitor for selectively transmitting and receiving an AC signal at the first and second outputs of the integrated circuit across the first and second voltage isolation capacitors.

2. The integrated circuit of claim 1, wherein the first conductive layer and the second conductive layer are separated by at least one dielectric layer.

3. The integrated circuit of claim 1, wherein the integrated circuit comprises at least five spatially ordered metal layers, the first conductive layer being the second metal layer of the at least five metal layers and the second conductive layer being the fifth metal layer of the at least five metal layers.

4. The integrated circuit of claim 1, wherein the second area of the integrated circuit includes a plurality of capacitive isolation circuitries.

5. The integrated circuit of claim 1, wherein the transceiver circuitry further comprises:
   a differential transmitter for transmitting the AC signal to the first and second voltage isolation capacitors; and
   a differential receiver for receiving the AC signal from the first and second voltage isolation capacitors.

6. The integrated circuit of claim 5, wherein the differential transmitter further comprises:
   first circuitry for transmitting the AC signal on the first voltage isolation capacitor responsive to the applied AC signal and an applied data signal; and
   second circuitry for transmitting the AC signal phase shifted from the AC signal transmitted from the first circuitry on the second voltage isolation capacitor responsive to the applied AC signal and the applied data signal.

7. The integrated circuit of claim 5, wherein the first circuitry and the second circuitry included a transmission gate for disabling transmissions from the first circuitry and the second circuitry respectively.

8. The integrated circuit of claim 5, wherein the differential receiver further comprises:
   a common mode clamp connected to each of the first voltage isolation capacitor and the second voltage isolation capacitor to prevent nodes associated with the capacitors from floating; and
   a receiver amplifier connected to the first voltage isolation capacitor and the second voltage isolation capacitor for detecting the transmitted AC signal from the first voltage isolation capacitor and for detecting the transmitted AC signal offset from the transmitted AC signal on the first capacitor from the second voltage isolation capacitor.

9. The integrated circuit of claim 1, wherein the first output and the second output of the integrated circuit comprise a connection pad located above the second plate and the fourth plate respectively.

10. The integrated circuit of claim 1, wherein the first output and the second output of the integrated circuit comprise at least one of the first plate, the second plate, the third plate and the fourth plate.

11. The integrated circuit of claim 1, wherein the first voltage isolation capacitor and the second voltage isolation capacitor comprises at least one of a horizontal capacitor, a vertical capacitor or a combination thereof.

12. The integrated circuit of claim 1, wherein the AC signal may be selectively established for the transceiver circuitry.

* * * * *